United States Patent
Yang et al.

(10) Patent No.: US 9,252,158 B2
(45) Date of Patent: Feb. 2, 2016

(54) THIN FILM TRANSISTOR ARRAY PANEL AND METHOD OF MANUFACTURING THE SAME

(71) Applicant: Samsung Display Co., Ltd., Yongin, Gyeonggi-do (KR)

(72) Inventors: Sung Hoon Yang, Yongin (KR); Hyeong Suk Yoo, Yongin (KR); Hae Yoon Jung, Yongin (KR); Jong-Chul Park, Yongin (KR); Jong Hyun Park, Yongin (KR); Jang-Ki Baek, Yongin (KR); Eun-Chan Lim, Yongin (KR)

(73) Assignee: Samsung Display Co., Ltd. (KR)

( * ) Notice: Subject to any disclaimer, the term of this patent is extended or adjusted under 35 U.S.C. 154(b) by 45 days.

(21) Appl. No.: 14/101,604

(22) Filed: Dec. 10, 2013

(65) Prior Publication Data
US 2015/0008434 A1  Jan. 8, 2015

(30) Foreign Application Priority Data
Jul. 3, 2013  (KR) .................. 10-2013-0078064

(51) Int. Cl.
*H01L 27/12* (2006.01)
*H01L 29/786* (2006.01)

(52) U.S. Cl.
CPC .......... *H01L 27/1222* (2013.01); *H01L 27/127* (2013.01); *H01L 29/78696* (2013.01)

(58) Field of Classification Search
CPC ..................... H01L 27/1222; H01L 27/127
See application file for complete search history.

(56) References Cited

U.S. PATENT DOCUMENTS

| | | | |
|---|---|---|---|
| 7,989,332 B2 * | 8/2011 | Yamazaki et al. | 438/591 |
| 8,049,215 B2 | 11/2011 | Jinbo et al. | |
| 8,294,155 B2 | 10/2012 | Yamazaki et al. | |
| 8,304,775 B2 | 11/2012 | Miyairi et al. | |
| 2007/0145374 A1 | 6/2007 | Whangbo et al. | |
| 2009/0090915 A1 * | 4/2009 | Yamazaki et al. | 257/66 |

FOREIGN PATENT DOCUMENTS

| | | |
|---|---|---|
| JP | 06-163901 | 6/1994 |
| JP | 07-211909 | 8/1995 |
| JP | 2010-135502 | 6/2010 |
| JP | 2010-192877 | 9/2010 |
| KR | 10-2006-0021005 | 3/2006 |
| TW | 200730986 | 8/2007 |

\* cited by examiner

*Primary Examiner* — Lex Malsawma
(74) *Attorney, Agent, or Firm* — Knobbe Martens Olson & Bear LLP

(57) ABSTRACT

A thin film transistor array panel includes a first insulating substrate, a gate electrode positioned on the first insulating substrate, a gate insulating layer positioned on the gate electrode, a semiconductor layer positioned on the gate insulating layer, and a source electrode and a drain electrode positioned on the semiconductor layer and spaced apart from each other, in which the semiconductor layer includes three or more amorphous silicon layers having different bandgap energies from one another in order to reduce a leakage current and improve performance of a liquid crystal display.

7 Claims, 10 Drawing Sheets

FIG. 10

|  |  | (a) | (b) | (c) |
|---|---|---|---|---|
| Ion | ave | 7.77E-07 | 6.91E-07 | 8.52E-07 |
|  | max | 9.00E-07 | 9.00E-07 | 1.02E-06 |
|  | min | 5.80E-07 | 5.20E-07 | 6.40E-07 |
|  | unif | 2.16E+01 | 2.68E+07 | 2.29E+01 |
| Ioff | ave | 6.58E-13 | 2.03E-13 | 2.25E-13 |
|  | max | 2.98E-12 | 4.22E-13 | 8.62E-13 |
|  | min | 2.36E-13 | 1.02E-13 | 1.06E-13 |
|  | unif | 8.53E+01 | 6.09E+01 | 7.81E+01 |

THIN FILM TRANSISTOR ARRAY PANEL AND METHOD OF MANUFACTURING THE SAME

CROSS-REFERENCE TO RELATED APPLICATION

This application claims priority to, and the benefit of, Korean Patent Application No. 10-2013-0078064 filed in the Korean Intellectual Property Office on Jul. 3, 2013, the entire contents of which are incorporated herein by reference.

BACKGROUND

1. Field

The present disclosure relates to a thin film transistor array panel and a method of manufacturing the same.

2. Description of the Related Technology

A flat panel display may be used as a display device, and various display devices such as a liquid crystal display, an organic light emitting diode device, a plasma display device, an electrophoretic display, and an electrowetting display device, among others, may be used as the flat panel display.

Among the display devices, a liquid crystal display is currently one of the most widely used flat panel displays, and includes two display panels on which field generating electrodes such as a pixel electrode and a common electrode are formed, a liquid crystal layer interposed therebetween, and a backlight unit providing light to the display panels pinching the liquid crystal layer. The liquid crystal display displays an image by applying a voltage to the field generating electrode to generate an electric field on the liquid crystal layer, determining directions of liquid crystal molecules of the liquid crystal layer therethrough, and controlling an emission quantity of light provided by the backlight unit.

Generally, the display device including the liquid crystal display includes a thin film transistor array panel. The thin film transistor array panel is formed of a gate electrode that is a portion of a gate wire, a semiconductor layer forming a channel, and a source electrode and a drain electrode that are a portion of the data wire. The thin film transistor is a switching element transferring an image signal transferred through the data wire to the pixel electrode according to a scanning signal transferred through the gate wire, or interrupting the image signal.

If light is radiated on the semiconductor layer of a portion protruding over line widths of source and drain electrodes, a bond of amorphous silicon molecules in the semiconductor layer is broken by light energy to form an electron hole pair (e-h pair).

The above information disclosed in this Background section is only for enhancement of understanding of the background and therefore it may contain information that does not form the prior art that is already known in this country to a person of ordinary skill in the art.

SUMMARY OF CERTAIN INVENTIVE ASPECTS

The present disclosure has been made in an effort to provide a thin film transistor array panel in which a leakage current is reduced, and a method of manufacturing the same.

One embodiment provides a thin film transistor array panel including: a first insulating substrate, a gate electrode positioned on the first insulating substrate, a gate insulating layer positioned on the gate electrode, a semiconductor layer positioned on the gate insulating layer, and a source electrode and a drain electrode positioned on the semiconductor layer and spaced apart from each other, in which the semiconductor layer includes amorphous silicon and at least three layers with different bandgap energies from one another.

The semiconductor layer may include a first semiconductor layer and a second semiconductor layer positioned on the first semiconductor layer, and a bandgap energy of the first semiconductor layer may be larger than the bandgap energy of the second semiconductor layer.

The semiconductor layer may further include a third semiconductor layer positioned on the second semiconductor layer, and the bandgap energy of the third semiconductor layer may be larger than the bandgap energy of the first semiconductor layer.

The value of the bandgap energy of the first semiconductor layer may be between values of the bandgap energies of the second semiconductor layer and the third semiconductor layer.

The bandgap energy of the first semiconductor later may be about 1 eV to about 2 eV.

$I_{off}$ of the semiconductor layer may be about $1.0 \times 10^{-13}$ to $5.0 \times 10^{-13}$.

The gate insulating layer may include a plurality of layers.

Another embodiment provides a method of manufacturing a thin film transistor array panel, including: forming a gate wire including a gate electrode on a first insulating substrate, forming a gate insulating layer on the gate wire, forming a semiconductor layer on the gate insulating layer, forming a data wire including a source electrode and a drain electrode on the semiconductor layer, and exposing the drain electrode and forming a pixel electrode electrically connected to the drain electrode, in which in the forming of the semiconductor layer, three or more semiconductor layers having different bandgap energies from one another are formed, and the semiconductor layer includes amorphous silicon.

The semiconductor layer may include a first semiconductor layer and a second semiconductor layer positioned on the first semiconductor layer, and the bandgap energy of the first semiconductor layer may be larger than the bandgap energy of the second semiconductor layer.

The semiconductor layer may further include a third semiconductor layer positioned on the second semiconductor layer, and the bandgap energy of the third semiconductor layer may be larger than the bandgap energy of the first semiconductor layer.

The value of the bandgap energy of the first semiconductor layer may be between values of the bandgap energies of the second semiconductor layer and the third semiconductor layer.

The bandgap energy of the first semiconductor layer may be in the range of about 1 eV to about 2 eV.

$I_{off}$ of the semiconductor layer may be about $1.0 \times 10^{-13}$ to $5.0 \times 10^{-13}$.

In the forming of the semiconductor layer, a chemical vapor deposition method may be used, and a deposition temperature may be about 150° C. to 350° C.

In the forming of the semiconductor layer, gas including $SiH_4$ and $SiF_4$ may be used.

In the forming of the semiconductor layer, used power may be increased in the order of the second semiconductor layer, the first semiconductor layer, and the third semiconductor layer.

The method of manufacturing the thin film transistor array panel may include at least four masks.

In the forming of the semiconductor layer, a gas ratio of $H_2/SiH_4$ of the third semiconductor layer may be the smallest.

The gate insulating layer may include a plurality of layers.

According to the aforementioned thin film transistor array panel, a leakage current is reduced, and thus an afterimage of a liquid crystal display is improved.

BRIEF DESCRIPTION OF THE DRAWINGS

FIG. 10 is a result table of experimental result numerical values of FIG. 9.

DETAILED DESCRIPTION OF THE PREFERRED EMBODIMENT

Figure 1:
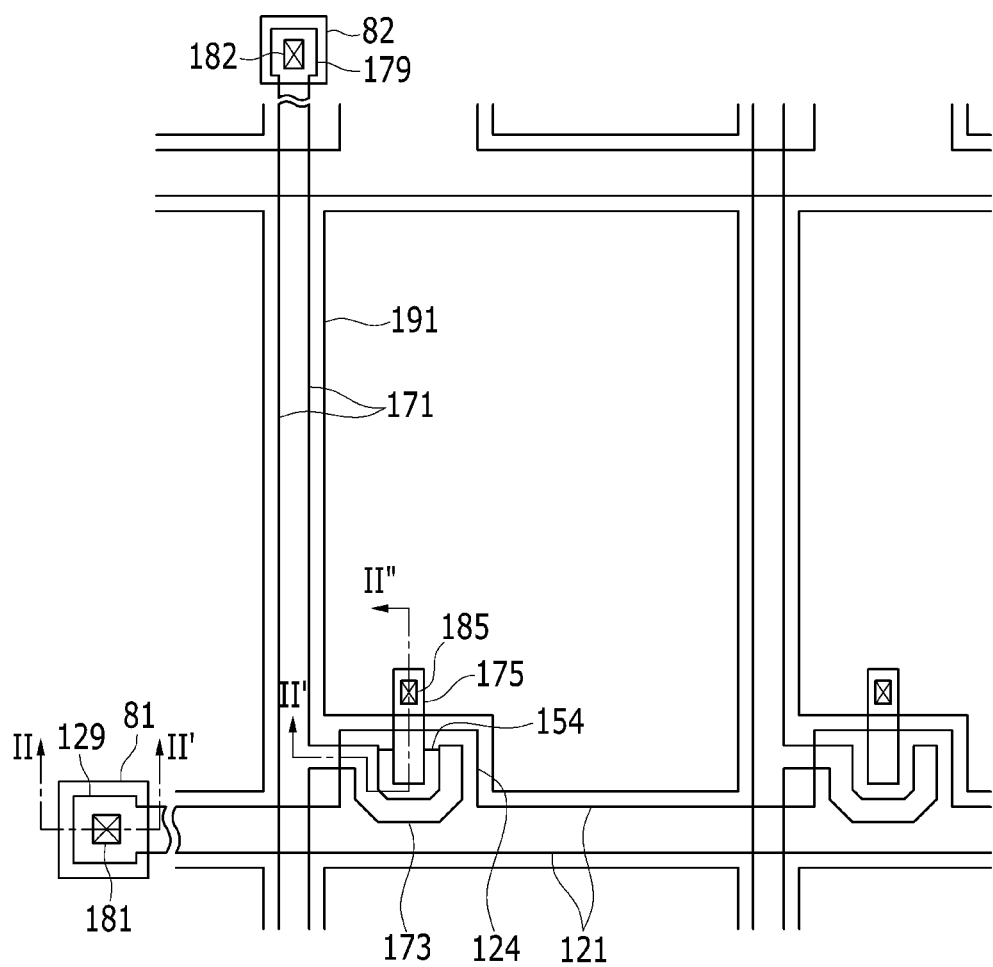
FIG. 1 is a top plan view according to an embodiment of the present invention.

Hereinafter, certain embodiments of the present invention will be described in detail with reference to the accompanying drawings. As those skilled in the art would realize, the described embodiments may be modified in various ways, without departing from the spirit or scope of the present invention. On the contrary, embodiments introduced herein are provided to make disclosed contents thorough and complete and sufficiently transfer the spirit of the present invention to those skilled in the art.

In the drawings, the thickness of layers, films, panels, regions, etc., may be exaggerated for clarity. It will be understood that when a layer is referred to as being "on" another layer or substrate, it can be directly on the other layer or substrate, or intervening them may also be present. Like reference numerals generally designate like elements throughout the specification.

A hole of the electron hole pair, formed when a bond of amorphous silicon molecules in the semiconductor layer is broken by light energy, moves toward the gate electrode by a voltage Vg applied to the gate electrode, and an electron moves toward the drain electrode, and thus a photoleakage current flows. Accordingly, when the switching element is turned off, there is a problem in that a current flows which generates an afterimage and display stains on a display screen.

A thin film transistor array panel according to an embodiment of the present invention will be described in detail with reference to the drawings. FIG. 1 is a top plan view illustrating a thin film transistor array panel according to an embodiment of the present invention, FIG. 2 is a cross-sectional view taken along cut lines II-II' and II'-II" of FIG. 1, and FIG. 3 is a cross-sectional view according to another embodiment of the present invention, which is taken along cut lines II-II' and II'-II" of FIG. 1.

Figure 2:
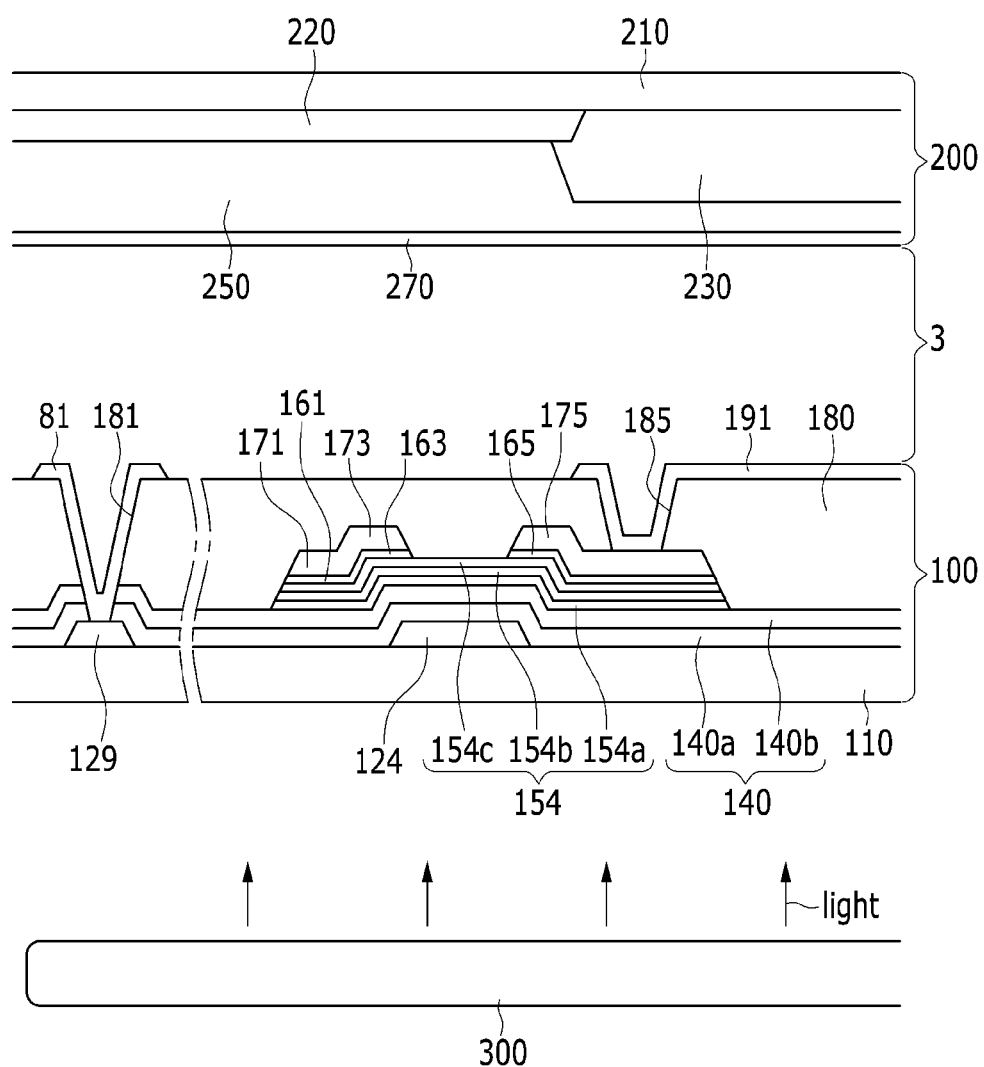
FIG. 2 is a cross-sectional view taken along cut lines II-II' and II'-II" of FIG. 1.
Figure 3:
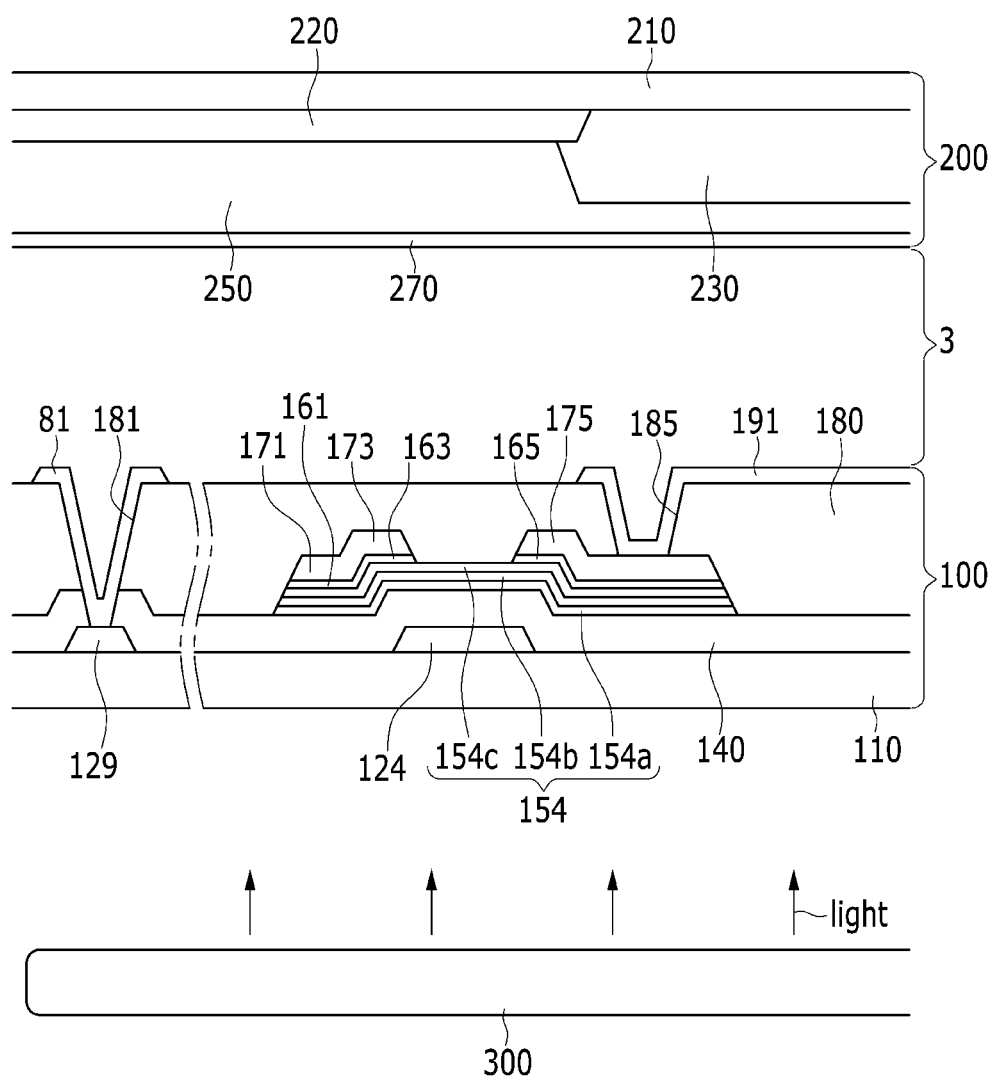
FIG. 3 is a cross-sectional view according to another embodiment of the present invention.

Referring to FIGS. 1 and 2, a liquid crystal display including a thin film transistor array panel 100 according to an embodiment includes the thin film transistor array panel 100 and an upper display panel 200, and a liquid crystal layer 3 interposed between two display panels 100 and 200, and a backlight unit 300 is positioned under the thin film transistor array panel 100. Further, a position of the backlight unit 300 is not limited to a position facing the thin film transistor array panel 100, but the backlight unit 300 may be disposed at a position facing the upper display panel 200.

First, the thin film transistor array panel 100 will be described.

A plurality of gate wires extending in a first direction and a plurality of data wires extending in a second direction that crosses the first direction are positioned on a first insulating substrate 110 made of transparent glass or plastic. A plurality of pixel portions is defined by the gate wires and the data wires on the first insulating substrate 110.

A gate wire 121 transfers a gate signal and mainly extends in a horizontal direction. Each gate wire 121 includes a plurality of gate electrodes 124 protruding from the gate wire 121 and a gate pad 129 that is a wide end portion for connection with another layer or a gate driver (not illustrated).

The gate electrode 124 may have the same metal pattern as the gate wire. In FIGS. 1 and 2, the case where the gate electrode 124 is a single layer is illustrated, but the gate electrode may also be a dual layer.

For example, in the case where the gate electrode 124 is the dual layer, the gate electrode 124 may have a structure where a lower metal layer formed of aluminum (Al) or aluminum neodymium (AlNd), and an upper metal layer formed of molybdenum (Mo), are sequentially laminated.

The lower metal layer is a layer acting as a passage of an electric signal, and is formed of aluminum (Al) or aluminum neodymium (AlNd) having low resistivity.

The upper metal layer is a layer positioned to protect the lower metal layer, and serves to prevent a hillock of aluminum (Al) occurring in a subsequent process at high temperatures, and to reduce contact resistance between the pixel electrode and the lower metal layer.

Next, a gate insulating layer 140 made of an insulating material such as silicon nitride is positioned on the gate wire 121. FIG. 2 illustrates the gate insulating layer 140 having a dual layer structure, and FIG. 3 includes the gate insulating layer 140 having a single layer structure according to another embodiment.

The gate insulating layer 140, as illustrated in FIG. 2, may include a lower gate insulating layer 140a and an upper gate insulating layer 140b positioned thereon.

The lower gate insulating layer 140a may be formed of an insulating material such as silicon nitride to prevent the gate electrode 124 from being oxidized, and the upper gate insulating layer 140b may be formed of a more nitrogen-rich insulating material, as compared to the lower gate insulating layer 140a, to prevent deterioration of a characteristic due to reaction of a semiconductor layer 154 adjacent thereto, and to oxygen.

Next, the semiconductor layer 154 made of amorphous silicon, such as hydrogenated amorphous silicon or polysilicon, is positioned on the gate insulating layer 140. In one embodiment, the semiconductor layer 154 includes hydrogenated amorphous silicon (a-si:H).

The semiconductor layer 154 mainly extends in a vertical direction, and includes a plurality of projections extending toward the gate electrode 124.

The semiconductor layer 154 may include a plurality of layers having different bandgap energies, for example, three or more layers as illustrated in FIGS. 2 and 3.

The semiconductor layer 154 includes a first semiconductor layer 154a, a second semiconductor layer 154b positioned on the first semiconductor layer 154a, and a third semiconductor layer 154c positioned on the second semiconductor layer 154b. FIG. 2 illustrates the semiconductor layer 154 having a triple layer, but embodiments are not limited thereto, and may include a dual-layered semiconductor layer 154 in which the third semiconductor layer 154c is omitted.

The first semiconductor layer 154a has bandgap energy that is larger than the bandgap energy of the second semiconductor layer 154b. The bandgap energy of the first semiconductor layer 154a may be about 1 eV to about 2 eV, for example, about 1.655 eV. Further, the first semiconductor layer 154a has a value between bandgap energies of the second semiconductor layer 154b and the third semiconductor layer 154c, for example, may have an intermediate value. The first semiconductor layer 154a comes into contact with the gate insulating layer 140 to reduce a quantity of a generated leakage current.

The second semiconductor layer 154b has a bandgap energy that is smaller than the bandgap energy of the first semiconductor layer 154a. The bandgap energy of the second semiconductor layer 154b may be about 1 eV to about 2 eV, for example, about 1.642 eV. Among a plurality of semiconductor layers 154, the second semiconductor layer 154b has the smallest number of defects and excellent performance.

The bandgap energy of the third semiconductor layer 154c is larger than the bandgap energy of the first semiconductor layer 154a. That is, the third semiconductor layer 154c has the largest bandgap energy among a plurality of semiconductor layers 154 formed of a triple layer. The bandgap energy of the third semiconductor layer 154c may be about 1 eV to about 2 eV, for example, about 1.672 eV.

The first semiconductor layer 154a to the third semiconductor layer 154c illustrated in FIGS. 2 and 3 have the same shape, but in other embodiments, a structure where the first semiconductor layer 154a is positioned only in a region in which a channel is formed is feasible.

A plurality of ohmic contact stripes 161 and ohmic contact islands 165 are positioned on the projection of the semiconductor layer 154. The ohmic contact stripe 161 has a plurality of projections 163, and the projection 163 and the ohmic contact island 165 form a pair to be positioned on the projection of the semiconductor layer 154.

A plurality of data wires 171, a plurality of source electrodes 173 connected to the plurality of data wires 171, and a plurality of drain electrodes 175 facing the source electrodes 173 are positioned on the ohmic contact stripes 161 and islands 165 and the gate insulating layer 140.

The data wire 171 transfers a data signal and mainly extends in a vertical direction to cross the gate wire 121. The source electrode 173 may extend toward the gate electrode 124 to have a U shape, but this is just an example, and the source electrode 173 may have the various other shapes.

The drain electrode 175 is separated from the data wire 171, and extends upwardly from the middle of the U-shaped source electrode 173. The data wire 171 includes a data pad 179 having an area for connection with another layer or the data driver (not illustrated).

Although not illustrated in the drawings, the data wire 171, the source electrode 173, and the drain electrode 175 may have a dual-layered structure of an upper layer and a lower layer. The upper layer may be formed of copper (Cu) or a copper alloy, and the lower layer may be formed of any one of titanium (Ti), tantalum (Ta), molybdenum (Mo), and alloys thereof.

The data wire 171, the source electrode 173, and the drain electrode 175 may have a tapered lateral surface.

The ohmic contact stripes 161 and islands 165 exist only between the semiconductor layer 154 therebeneath and the data wire 171 and the drain electrode 175 thereon, and reduce contact resistance therebetween. Further, the ohmic contact stripes 161, projections 163, and islands 165 may have substantially the same plane pattern as the data wire 171, the source electrode 173, and the drain electrode 175.

In the projection of the semiconductor layer 154, there is an exposed portion that is not covered by the data wire 171 and the drain electrode 175, such as a portion between the source electrode 173 and the drain electrode 175. The semiconductor layer 154 has substantially the same plane pattern as the ohmic contact stripes 161 and islands 165 except for the exposed portion of the projection.

One gate electrode 124, one source electrode 173, and one drain electrode 175 form one thin film transistor TFT together with the projection of the semiconductor layer 154, and the channel of the thin film transistor is formed in the projection between the source electrode 173 and the drain electrode 175.

A passivation layer 180 is positioned on the data wire 171, the drain electrode 175, and the exposed portion of the projection of the semiconductor layer 154. The passivation layer 180 is made of an inorganic insulator such as silicon nitride or silicon oxide, an organic insulator, and a low dielectric insulator.

A contact hole 181 through which the gate pad 129 is exposed is positioned in the passivation layer 180 and the gate insulating layer 140. Further, a contact hole 182 through which the data pad 179 of the data wire 171 is exposed and a contact hole 185 through which an end of the drain electrode 175 is exposed are positioned in the passivation layer 180.

A pixel electrode 191 and contact assistants 81 and 82 are positioned on the passivation layer 180. They may be made of a transparent conductive material such as ITO or IZO, or reflective metal such as aluminum, silver, chromium, or an alloy thereof.

The pixel electrode 191 is physically electrically connected to the drain electrode 175 through the contact hole 185, and receives a data voltage from the drain electrode 175.

The contact assistants 81 and 82 are connected through the contact holes 181 and 182 to the gate pad 129 of the gate wire 121 and the data pad 179 of the data wire 171, respectively. The contact assistants 81 and 82 complement adherence between the gate pad 129 of the gate wire 121 and the data pad 179 of the data wire 171 and an external device, and protect the pads and the external device.

Next, the upper display panel 200 will be described with reference to FIG. 2.

A light blocking member 220 is positioned on a second insulating substrate 210 made of transparent glass, plastic, or the like. The light blocking member 220 prevents light leakage between the pixel electrodes 191 and defines an opening region facing the pixel electrode 191.

A plurality of color filters 230 is positioned on the second insulating substrate 210 and the light blocking member 220. The color filter 230 may be mainly present in the region surrounded by the light blocking member 220, and may longitudinally extend along a column of the pixel electrodes 191. Each color filter 230 may display any one of primary colors such as, for example, the three primary colors of red, green, and blue.

In one embodiment, the light blocking member 220 and the color filter 230 are positioned in the upper display panel 200, but at least one of the light blocking member 220 and the color filter 230 may be positioned in the thin film transistor array panel 100 in other embodiments.

An overcoat 250 is positioned on the color filter 230 and the light blocking member 220. The overcoat 250 may be made of an (organic) insulator, prevents exposure of the color filter 230, and provides a flat surface. The overcoat 250 may be omitted in some embodiments.

A common electrode 270 is positioned on the overcoat 250. The common electrode 270 is made of a transparent conductor such as ITO or IZO, and receives a common voltage Vcom.

The liquid crystal layer 3 interposed between the thin film transistor array panel 100 and the upper display panel 200 includes liquid crystal molecules having a negative dielectric anisotropy, and the liquid crystal molecules may be aligned so that long axes thereof are vertical in respect to the surfaces of two display panels 100 and 200 in a state in which there is no electric field.

The pixel electrode 191 and the common electrode 270 form a liquid crystal capacitor together with a portion of the liquid crystal layer 3 therebetween to maintain the applied voltage even after the thin film transistor is turned off.

The pixel electrode 191 may overlap with a storage electrode line (not illustrated) to form a storage capacitor, and a voltage storage ability of the liquid crystal capacitor may be increased therethrough.

In the embodiment as illustrated in FIG. 2, a backlight unit 300 may include a light source portion, a light guide plate, and the like, and provides light.

FIGS. 4 to 8 are process views illustrating a method of manufacturing the thin film transistor array panel illustrated in FIG. 2. A detailed description of the aforementioned same constituent elements will be omitted.

Figure 4:
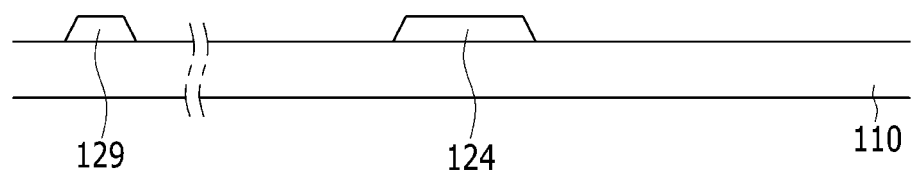
FIGS. 4 to 8 are cross-sectional views of a method of manufacturing the thin film transistor array panel according to an embodiment of the present invention.

Referring to FIG. 4, a metal layer is laminated on the first insulating substrate 110, and the gate wire 121 including the gate electrode 124 and the gate pad 129 is formed through a photolithography process (step 1).

In one embodiment, the gate wire is formed of a single layer, but may be formed of a dual layer, and in this case, the lower metal layer may be any one selected from aluminum (Al) or aluminum neodymium (AlNd), and the upper metal layer may be formed of molybdenum (Mo).

Figure 5:
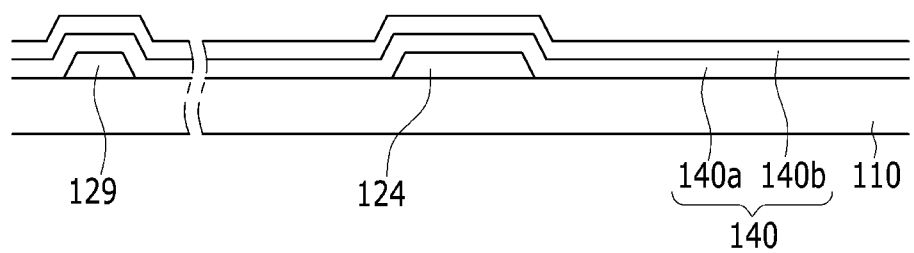

Referring to FIG. 5, the gate insulating layer 140 is formed on the gate wire 121 through a chemical vapor deposition (CVD) method (step 2). In this case, for example, silent gas ($SiH_4$), hydrogen gas ($H_2$), nitrogen gas ($NH_3$), or the like is provided into a CVD chamber forming the gate insulating layer 140.

In one embodiment, the gate insulating layer 140 of the dual layer includes the lower gate insulating layer 140a and the upper gate insulating layer 140b positioned thereon, but is not limited thereto, and the gate insulating layer 140 of a single layer may be provided.

The lower gate insulating layer 140a may be formed of an insulating material such as silicon nitride to prevent the gate electrode 124 from being oxidized, and the upper gate insulating layer 140b may be formed of a more nitrogen-rich insulating material as compared to the lower gate insulating layer 140a to prevent deterioration of a characteristic due to reaction of a semiconductor layer 154 adjacent thereto, and oxygen.

The aforementioned gate insulating layer 140 of the dual layer can be controlled by adjusting power and a gas composition ratio used during deposition. The upper gate insulating layer 140b is deposited under a condition of power which is lower than that of the lower gate insulating layer 140a and a ratio of $NH_3/SiH_4$ which is higher than that of the lower gate insulating layer 140a. According to the aforementioned deposition, a deposition speed of the upper gate insulating layer 140b is lower than that of the lower gate insulating layer 140a, but an insulating layer having a density which is higher than that of the lower gate insulating layer 140a may be formed.

Further, the gate insulating layer 140 including a plurality of layers of two or more layers can be formed by the aforementioned method.

Figure 6:
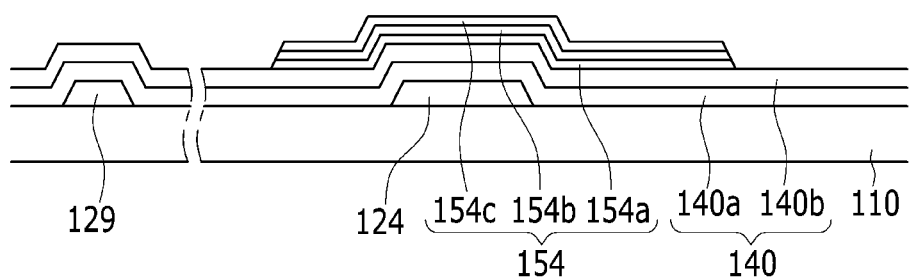

Referring to FIG. 6, after the gate insulating layer 140 is formed (step 2), the source gas including $SiF_4$ gas and $SiH_4$ gas is provided into the CVD chamber to form the semiconductor layer 154 formed of amorphous silicon (a-Si:H) (step 3).

In step 3, a deposition temperature in the CVD chamber may be about 150° C. to 350° C., for example, about 300° C.

The semiconductor layer 154 includes a plurality of semiconductor layers having different bandgap energies. According to one embodiment, a triple-layered structure including the first semiconductor layer 154a, the second semiconductor layer 154b positioned on the first semiconductor layer 154a, and the third semiconductor layer 154c positioned on the second semiconductor layer 154b is formed. However, the semiconductor layer 154 is not limited thereto, and a dual-layered semiconductor layer 154 in which the third semiconductor layer 154c is omitted can be formed.

A plurality of semiconductor layers 154 having different bandgap energies is formed by controlling a condition in the CVD chamber. Particularly, the bandgap energy is controlled by making the powers and the ratios of the source gases provided into the chamber different from each other. The aforementioned method is described in order to control the bandgap energy, but the method is not limited thereto, and any method for controlling the bandgap energy may be used.

The power in the chamber is adjusted so as to be increased in the order of the second semiconductor layer 154b, the first semiconductor layer 154a, and the third semiconductor layer 154c. The lower the power is, the lower the deposition speed is and the higher the ratio of [Si—H]/[Si—H2] is.

In addition, in the source gas, the ratio of H2/SiH4 gases is lowest in the case of the third semiconductor layer 154c, and the ratios of the first semiconductor layer 154a and the second semiconductor layer 154b are adjusted to be the same as each other.

This is because if the power in the chamber is low and the ratio of H2/SiH4 gases is high, the number of defects tends to be reduced through the aforementioned control, and thus the bandgap energy may be largely adjusted.

That is, if the power is high and the ratio of gases is low, the third semiconductor layer 154c having somewhat many defects and the large bandgap energy is formed, and if the power is low and the ratio of gases is high, the second semiconductor layer 154b having a few defects and the small bandgap energy is formed. The first semiconductor layer 154a having intermediate bandgap energy is formed through this control.

Further, when the mixed gas of the SiF4 gas and the SiH4 gas is considered 100%, in the case where the occupying ratio of the SiF4 gas is less than 25% or more than 80%, it is difficult to form the semiconductor layer 154 formed of a-Si:H. Accordingly, it is preferable that the ratio of the SiF4 gas and the SiH4 gas included in the source gas be 1:3 to 4:1.

According to the aforementioned step 3, first, the first semiconductor layer 154a is formed. The bandgap energy of the first semiconductor layer 154a is about 1 eV to about 2 eV, for example, about 1.655 eV.

The second semiconductor layer 154b is formed to have a bandgap energy that is smaller than the bandgap energy of the first semiconductor layer 154a. This is controlled through adjustment of the power and the ratio of the source gases. The bandgap energy of the second semiconductor layer 154b is about 1 eV to about 2 eV, for example, about 1.642 eV. Among a plurality of semiconductor layers 154, the second semiconductor layer 154b has the smallest number of defects, the low bandgap energy, and excellent performance.

Finally, the bandgap energy of the third semiconductor layer 154c is formed to be larger than the bandgap energy of the first semiconductor layer 154a. That is, the third semiconductor layer 154c has the largest bandgap energy among a plurality of semiconductor layers 154 formed of a triple layer. The bandgap energy of the third semiconductor layer 154c is about 1 eV to about 2 eV, for example, about 1.672 eV.

Figure 7:
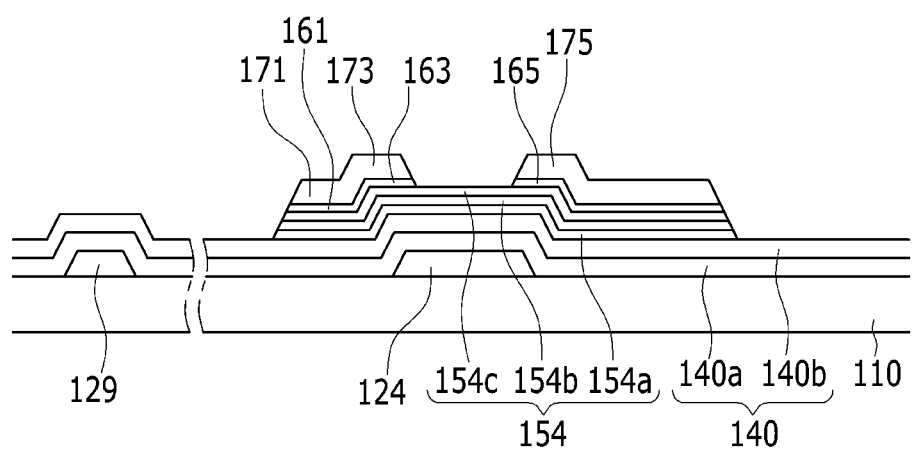

Referring to FIG. 7, in step 4, the ohmic contacts 165 are formed by providing, for example, silent gas ($SiH_4$), hydrogen gas ($H_2$), nitrogen gas ($NH_3$), and hydrogen phosphide gas ($PH_3$), into the CVD chamber.

Next, through the photolithography process, the data wire including the data line, the source electrode 173, and the drain electrode 175 is formed. The drain electrode 175 is spaced apart from the source electrode 173, and positioned at an upper portion of an opposite side of the source electrode 173 based on the gate electrode 124.

Next, the semiconductor layer 154 and the gate insulating layer 140 are exposed by etching the ohmic contact 165 positioned between the source electrode 173 and the drain electrode 175.

Figure 8:
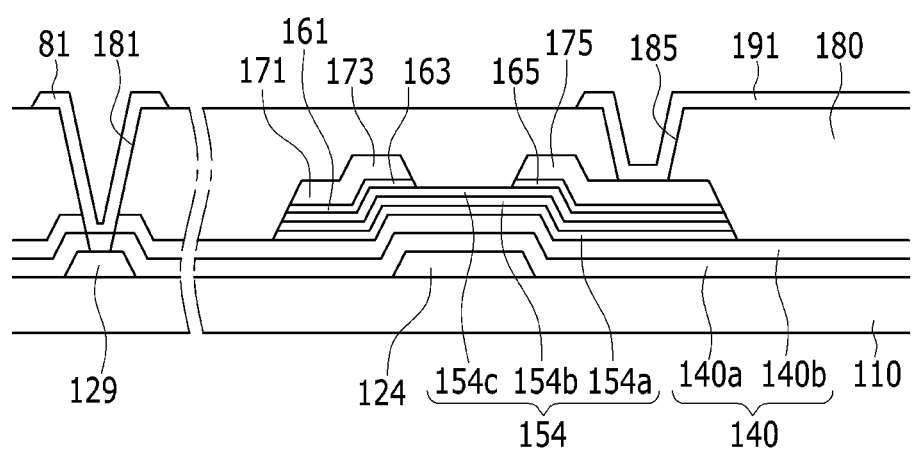

Next, referring to FIG. 8, after the passivation layer 180 is formed to cover the semiconductor layer 154, the contact hole 185 through a portion of the drain electrode 175 is exposed is formed through the photolithography process. A transparent conductive layer (not illustrated) is deposited on the passivation layer 180, and the pixel electrode 191 electrically connected to the drain electrode through the photolithography process is formed (step 5).

A four mask process has been described, but a five mask process may also be used.

Hereinafter, performance of the thin film transistor array panel according to the embodiments of the present invention will be described with reference to FIGS. 9 and 10.

A voltage $V_g$ was applied to the gate electrode, and a current $I_d$ flowing through the source/drain electrodes was measured. A result thereof is represented by a graph in FIG. 9, and a table in which numerical values are described is illustrated in FIG. 10.

In FIG. 10, (a) is a Comparative Example including a known dual-layered semiconductor layer, (b) includes a triple semiconductor layer according to an embodiment of the present invention, (c) is an Example including a triple semiconductor layer according to an embodiment of the present invention and having the nitrogen-rich (N-rich) gate insulating layer as compared to the Comparative Example.

Figure 9:
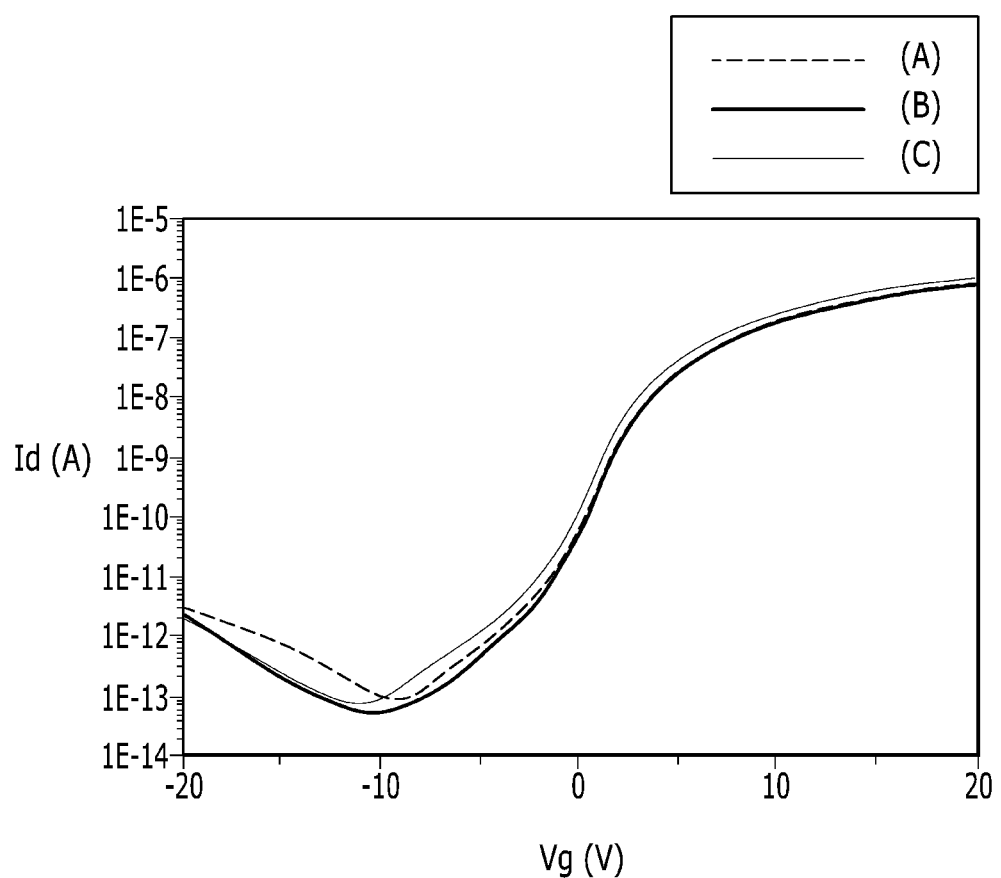
FIG. 9 is an experimental graph of an embodiment of the present invention.

In review of $I_{off}$ of FIGS. 9 and 10, both the maximum value and the minimum value were reduced in (b) and (c) according to embodiments of the present invention as compared to the Comparative Example (a). Particularly, in review of an average value, it can be seen that the leakage current is reduced by about 70 percent as compared to the Comparative Example. $I_{off}$ of the semiconductor layer is about $1.0 \times 10^{-13}$ to $5.0 \times 10^{-13}$, which is a significantly low numerical value as compared to the Comparative Example. Since the off leakage current causes fine driving of a switching element even though the switching element is in a turn-off state, the off leakage current is a cause of an afterimage. Accordingly, it can be seen that the liquid crystal display of the embodiments is very useful to remove the afterimage.

Further, reliability of the thin film transistor array panel of the embodiments was evaluated. Specifically, whether the thin film transistor array panel was driven at a high temperature of 60° C. or more or driven at a temperature of −40° C. or less was evaluated. According to the result thereof, it was confirmed that the thin film transistor array panel was favorably driven at the high temperature as a confirmation result of ASG Margin 96 hr and was favorably driven at the low temperature as a confirmation result of ASG Margin.

The thin film transistor array panel has been described as applied to the liquid crystal display, but the thin film transistor array panel 100 may be applied to any other display devices.

While this invention has been described in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 3: Liquid crystal layer | 81, 82: Contact assistants |
| 100: Thin film transistor array panel | 110: First insulating substrate |
| 121: Gate wire | 124: Gate electrode |
| 129: Gate pad | 140: Gate insulating layer |
| 140a: Lower gate insulating layer | 140b: Upper gate insulating layer |
| 154: Semiconductor layer | 154a: First semiconductor layer |
| 154b: Second semiconductor layer | 154c: Third semiconductor layer |
| 161: Ohmic stripe | 165: Ohmic island |
| 171: Data wire | 173: Source electrode |
| 175: Drain electrode | 179: Data pad |
| 180: Passivation layer | 185: Contact hole |
| 191: Pixel electrode | 200: Upper display panel |
| 210: Second insulating substrate | 220: Light blocking member |
| 230: Color filter | 250: Overcoat |
| 270: Common electrode | 300: Backlight unit |

What is claimed is:

1. A thin film transistor array panel comprising:
a first insulating substrate;
a gate electrode positioned on the first insulating substrate;
a gate insulating layer positioned on the gate electrode;
a semiconductor layer positioned on the gate insulating layer; and
a source electrode and a drain electrode positioned on the semiconductor layer and spaced apart from each other,
wherein the semiconductor layer includes amorphous silicon, and includes:
a first semiconductor layer formed on the gate insulating layer,
a second semiconductor layer formed over the entire top portion of the first semiconductor layer, and
a third semiconductor layer formed over the entire top portion of the second semiconductor layer, and
wherein the first, second and third semiconductor layers having different bandgap energies from one another.

2. The thin film transistor array panel of claim 1, wherein:
a bandgap energy of the first semiconductor layer is larger than the bandgap energy of the second semiconductor layer.

3. The thin film transistor array panel of claim 1, wherein:
the bandgap energy of the third semiconductor layer is larger than the bandgap energy of the first semiconductor layer.

4. The thin film transistor array panel of claim 1, wherein:
a value of the bandgap energy of the first semiconductor layer is between values of the bandgap energies of the second semiconductor layer and the third semiconductor layer.

5. The thin film transistor array panel of claim 1, wherein:
the bandgap energy of the first semiconductor layer is about 1 eV to about 2 eV.

6. The thin film transistor array panel of claim 1, wherein: $I_{off}$ of the semiconductor layer is about $1.0 \times 10^{-13}$ to $5.0 \times 10^{-13}$.

7. The thin film transistor array panel of claim 1, wherein: the gate insulating layer includes a plurality of layers.

* * * * *